United States Patent [19]

Takahashi

[11] Patent Number: 5,457,383
[45] Date of Patent: Oct. 10, 1995

[54] LOW POWER CONSUMPTION FLUXMETER FOR DETERMINING MAGNETIC FIELD STRENGTH IN THREE DIMENSIONS

[75] Inventor: Tomohiro Takahashi, Tokyo, Japan

[73] Assignee: Seiko Instruments Inc., Japan

[21] Appl. No.: 39,887

[22] Filed: Mar. 30, 1993

[30] Foreign Application Priority Data

Apr. 6, 1992 [JP] Japan .................................. 4-084229

[51] Int. Cl.$^6$ .............................. G01R 33/02; G01B 7/14
[52] U.S. Cl. ...................... 324/247; 324/207.26; 324/260
[58] Field of Search ..................................... 324/247, 253, 324/207.26, 260

[56] References Cited

U.S. PATENT DOCUMENTS

| | | | |
|---|---|---|---|
| 4,635,207 | 1/1987 | Payne | 324/247 X |
| 4,829,250 | 5/1989 | Rotier | 234/247 X |
| 4,851,775 | 7/1989 | Kim et al. | 324/247 |
| 5,151,649 | 9/1992 | Héroux | 324/247 X |
| 5,168,222 | 12/1992 | Volsin et al. | 324/247 X |

*Primary Examiner*—Sandra L. O'Shea
*Assistant Examiner*—Warren S. Edmonds
*Attorney, Agent, or Firm*—Adams & Wilks

[57] ABSTRACT

A reduced power consumption fluxmeter is provided which is capable of measuring the effect of continued exposure to an incident magnetic field. An incident magnetic field is measured on a sampled basis by a magnetic detecting element and integrated throughout the entire duration of continued exposure. A measurement time interval between successive measurements is calculated in accordance with the variation in magnitude between successive measurements. In one embodiment, the incident field is measured in three dimensions such that the fluxmeter is not sensitive to the direction of the incident field or the orientation of the fluxmeter. An analog-to-digital converting circuit is provided for converting detected values to digital values and the successive integrations are approximated by multiplying a calculated magnetic flux strength vector by the measuring time period. The integrated values are successively added and stored in a register. The integrated value is displayed by a display element. By varying the measuring time interval in accordance with the variation between successive measurements, the inventive fluxmeter conserves energy without losing any degree of precision.

3 Claims, 6 Drawing Sheets

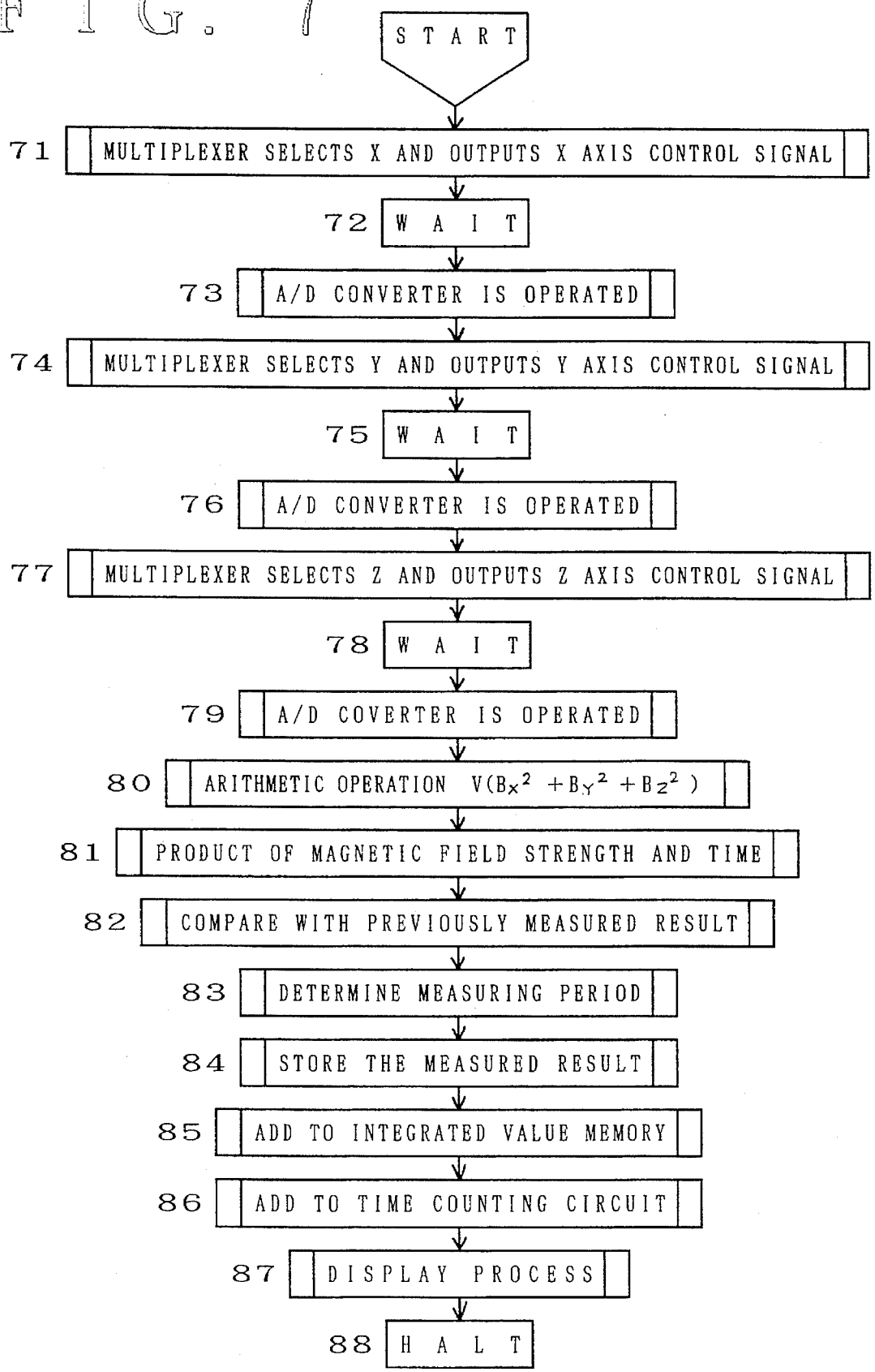

5,457,383

LOW POWER CONSUMPTION FLUXMETER FOR DETERMINING MAGNETIC FIELD STRENGTH IN THREE DIMENSIONS

BACKGROUND OF THE INVENTION

Recently, there has been studied an effect of electric wave and magnetic field radiation which are briefly classified a as "non-ionizing radiation, " on living beings. The present invention relates in particular to a three-dimensional integrating fluxmeter for measuring magnetic field strength irrespective of the direction of the magnetic field to measure the integrated value of the magnetic field strength.

A fluxmeter commonly referred to as "(a saturation iron core type flux gate has been conventionally used to measure magnetic flux radiated from a ferromagnetic material. However, the flux gate can be used only to measure instantaneous magnetic flux in the measuring environment and cannot measure the accumulated magnetic field strength.

SUMMARY OF THE INVENTION

It is an object of the present invention to provide a three-dimensional integrating fluxmeter meeting the above-mentioned requirements by combining a magnetic detecting element means comprising a triaxial magnetic detecting element and amplifying means with time counting means, to reduce power consumption, and by driving the triaxial magnetic detecting element and amplifying means on a time-sharing basis to further reduce power consumption.

In order to overcome the above-mentioned problems in the conventional fluxmeter, a portable fluxmeter of the present invention iteratively counts integrated values of the magnitude of incident magnetic flux due to continued exposure by using triaxial magnetic detecting means disposed in three-dimensions. The fluxmeter is provided with timing signal generating means for determining the optimal timing of the measuring period for performing the integration, and operational control means for sequentially controlling operations of the triaxial magnetic detecting means and the amplifying means for amplifying the respective detected outputs. As a result, it is possible to reduce the power consumption and to extend the lifetime of a battery used to power the portable fluxmeter.

The portable fluxmeter is constructed as described above to iteratively count or add the integrated values of magnitude of magnetic flux due to continued exposure to a magnetic field. Further, the fluxmeter has three amplifying means for amplifying the respective detected signals from the three magnetic detecting means disposed in three-dimensions in X, Y and z axial directions. The operational control means is operated to control the magnetic detecting means and the amplifying means. A multiplexer selects output signals of three amplifying means according to control signal from the operational control means. A/D (analog-to-digital) converting means converts analog signals output from the multiplexer to digital signals. Arithmetic means is operated to calculate magnetic flux strength depending upon the digital signal output from the A/D converting means, and to calculate measuring time. The arithmetic means calculates the total sum of the products of the measuring time and the magnetic flux strength, which sum is stored in integrated value storage means. The magnetic flux strength is temporarily stored in previously measured value storage means. In order to reduce calculation time and power consumption, measured value comparing means is included to compare the magnetic flux strength with previously measured magnetic flux strength. The timing signal generating means changes the measuring period according to the output signal from the measured value comparing means. Time counting means is operated to count the measuring time. A display element is controlled by display control means and displays content of the integrated value storage means.

When the fluxmeter is constructed as set forth above, the triaxial magnetic detecting means is driven on a time-sharing basis and at a variable measuring period determined so as to minimize power consumption. Thus, it is possible to extend operating time by a built-in battery.

BRIEF DESCRIPTION OF THE DRAWINGS

FIG. 7 is a flowchart showing operating procedure of the embodiment of the three-dimensional integrating fluxmeter of the present invention.

DETAILED DESCRIPTION OF THE PREFERRED EMBODIMENTS

An embodiment of the present invention will now be described with reference to the drawings.

Figure 1:
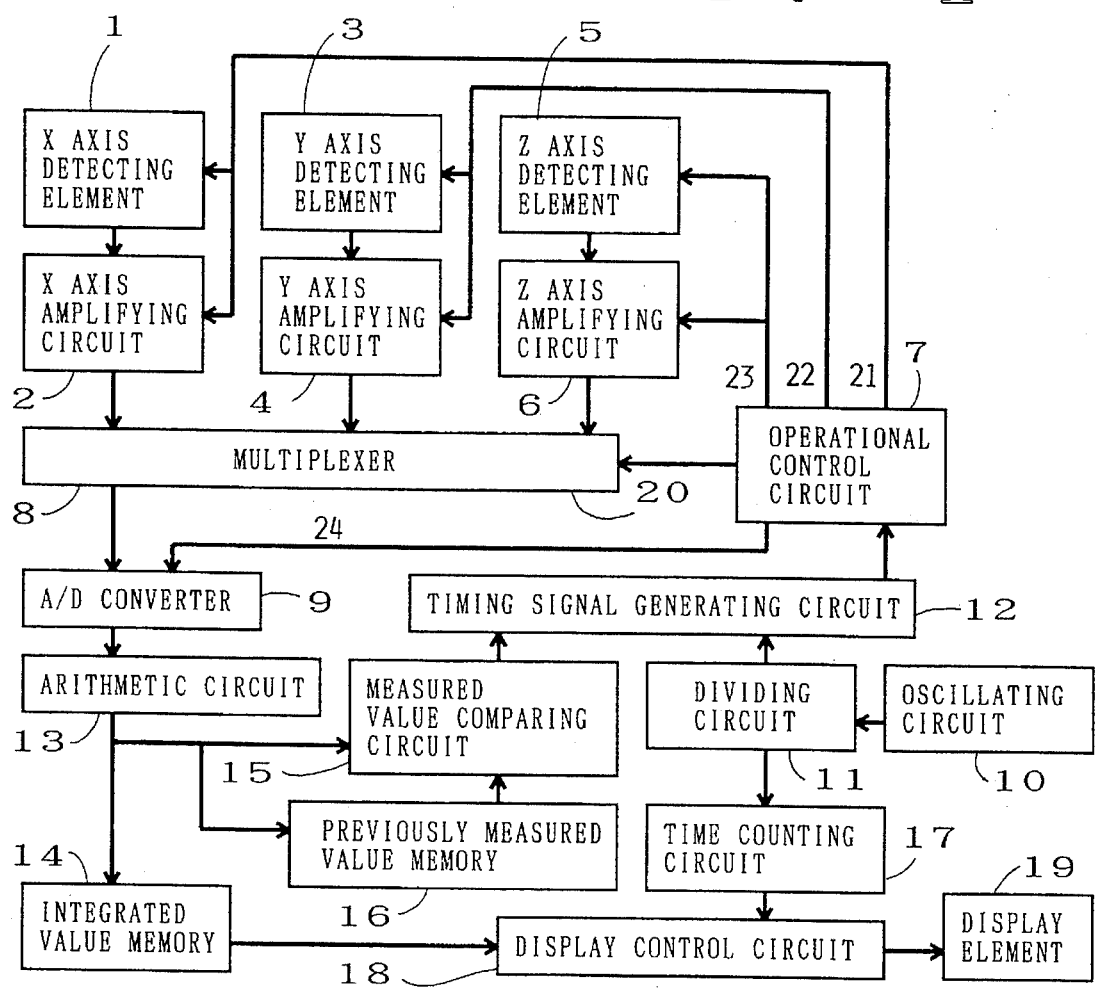
FIG. 1 is a block diagram showing an embodiment of a three-dimensional integrating fluxmeter in accordance the present invention.

FIG. 1 is a block diagram showing the embodiment of a three-dimensional integrating fluxmeter of the present invention. In FIG. 1, a detected magnetic signal from the X axis detecting element 1 disposed along the X axis is amplified by the X axis amplifying circuit 2. Similarly, a detected magnetic signal from the Y axis detecting element 3 disposed along the Y axis is amplified by the Y axis amplifying circuit 4. Detected signal from the Z axis detecting element 5 disposed on a z axis is amplified by the Z axis amplifying circuit 6. The X axis detecting element 1, the Y axis detecting element 3, the z axis detecting element 5, the X axis amplifying circuit 2, the Y axis amplifying circuit 4 and the z axis amplifying circuit 6 are controlled by control signals 21, 22 and 23 from operational control circuit 7. Output signals from the X axis amplifying circuit 2, the Y axis amplifying circuit 4 and the z axis amplifying circuit 6 are selected by a multiplexer 8 according to a respective control signal from the operational control circuit 7. Output signals from the multiplexer 8, i.e., output signals of analog values from the X axis amplifying circuit 2, the Y axis amplifying circuit 4 and the Z axis amplifying circuit 6 are converted to digital values by A/D converter 9 according to a control signal 24 from the operational control circuit 7.

Figure 2:
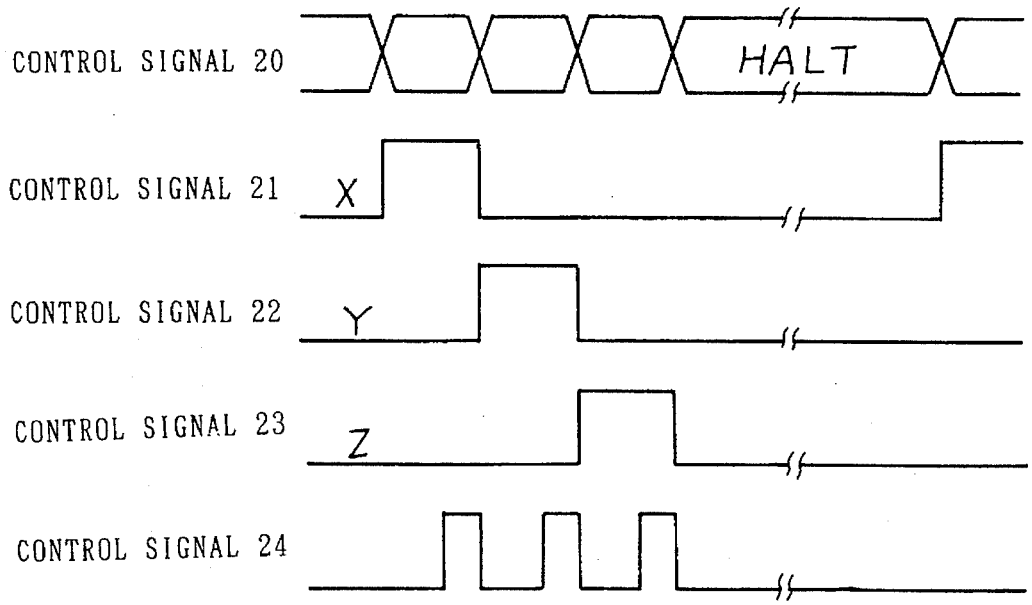
FIG. 2 is a time chart of control signals output by the operational control means in the embodiment of the three-dimensional integrating fluxmeter of the present invention.

FIG. 2 shows a time chart of control signals output by the operational control circuit 7 in the embodiment of the three-dimensional integrating fluxmeter of the present invention.

An output signal from an oscillating circuit 10 is divided by a frequency dividing circuit 11. Timing signal generating circuit 12 is operated to determine a measuring period depending upon the output signal from the frequency dividing circuit 11 and the output signal from the measured value comparing circuit 15. The control signal output from the operational control circuit 7 is controlled according to the output signal from the timing signal generating circuit 12.

An arithmetic circuit 13 is operated to convert the digital electric signal output by the A/D converter 9 to a magnetic field strength value and to perform an arithmetic operation on each magnetic field strength component on X, Y and Z axes so as to find actual magnetic field strength.

Figure 3:
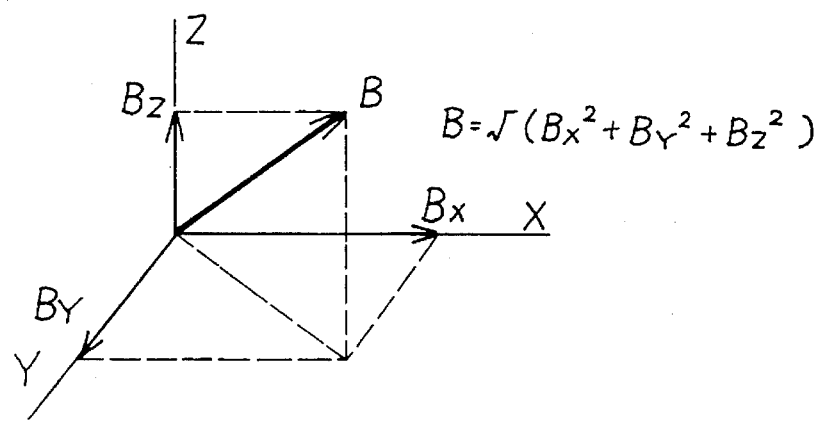
FIG. 3 is a diagram of magnetic field strength resolved into three axes (X, Y and Z axes) in the embodiment of the three-dimensional integrating fluxmeter of the present invention.

FIG. 3 shows a diagram of magnetic field strength resolved into three axes (X, Y and z axes) in the embodiment of the three-dimensional integrating fluxmeter of the present invention. Referring to FIG. 3, the magnetic field strength (magnetic flux density) B is expressed as follows:

$$B=\sqrt{(B_x^2+B_y^2+B_z^2)} \quad (1)$$

The arithmetic circuit 13 is then operated to calculate the product of the obtained magnetic field strength B and time of the measuring period, and to add the product to the contents of integrated value memory 14 to store again.

Figure 4:
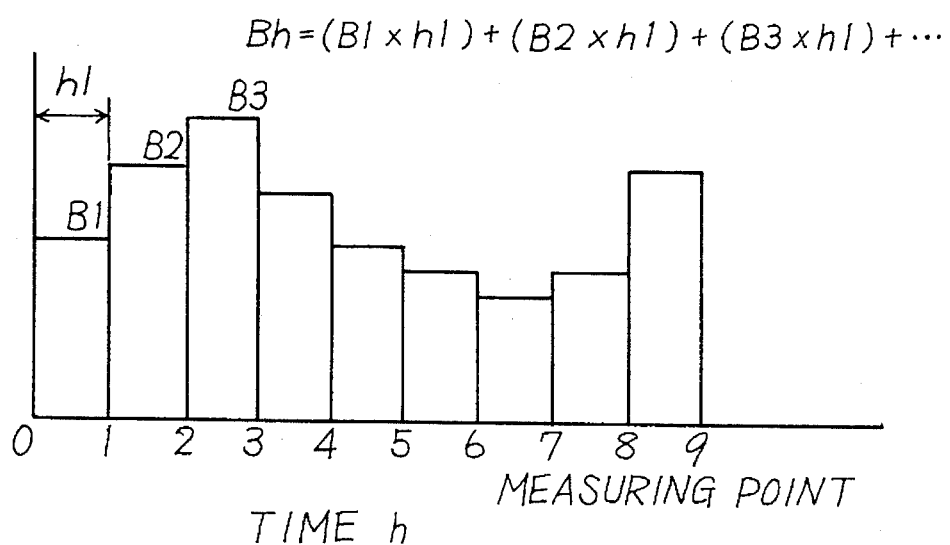
FIG. 4 is a diagram showing one the example of integrating method in the embodiment of the three-dimensional integrating fluxmeter of the present invention.

FIG. 4 is a diagram showing one example of the integrating method in the embodiment of the three-dimensional integrating fluxmeter of the present invention. The magnitude of magnetic flux Bh is stored in the integrated value memory 14.

The magnitude of the magnetic flux Bh is expressed as follows:

$$Bh=\Sigma(Magnetic\ flux\ strength\ B * Time\ h) \quad (2)$$

The output signal from the arithmetic circuit 13 is also input into measured value comparing circuit 15 and previously measured value memory 16. The signal input to the measured value comparing circuit 15 is compared with previously measured value output from the previously measured value memory 16 and the output of the measured value comparing circuit 15 is proportional to the difference between the measured magnetic flux value Bh(t) and the previously measured magnetic flux value Bh(t−1). This signal serves to control the timing signal generating circuit 12 so as to change the measuring period according to the result of the comparison.

A display element 19 is operated by a display control device 18 to display the contents of the integrated value memory 14 and time counting circuit 17 for counting output signals from the frequency dividing circuit 11 to count the entire measuring time from measuring start through display control circuit 18.

Figure 5:
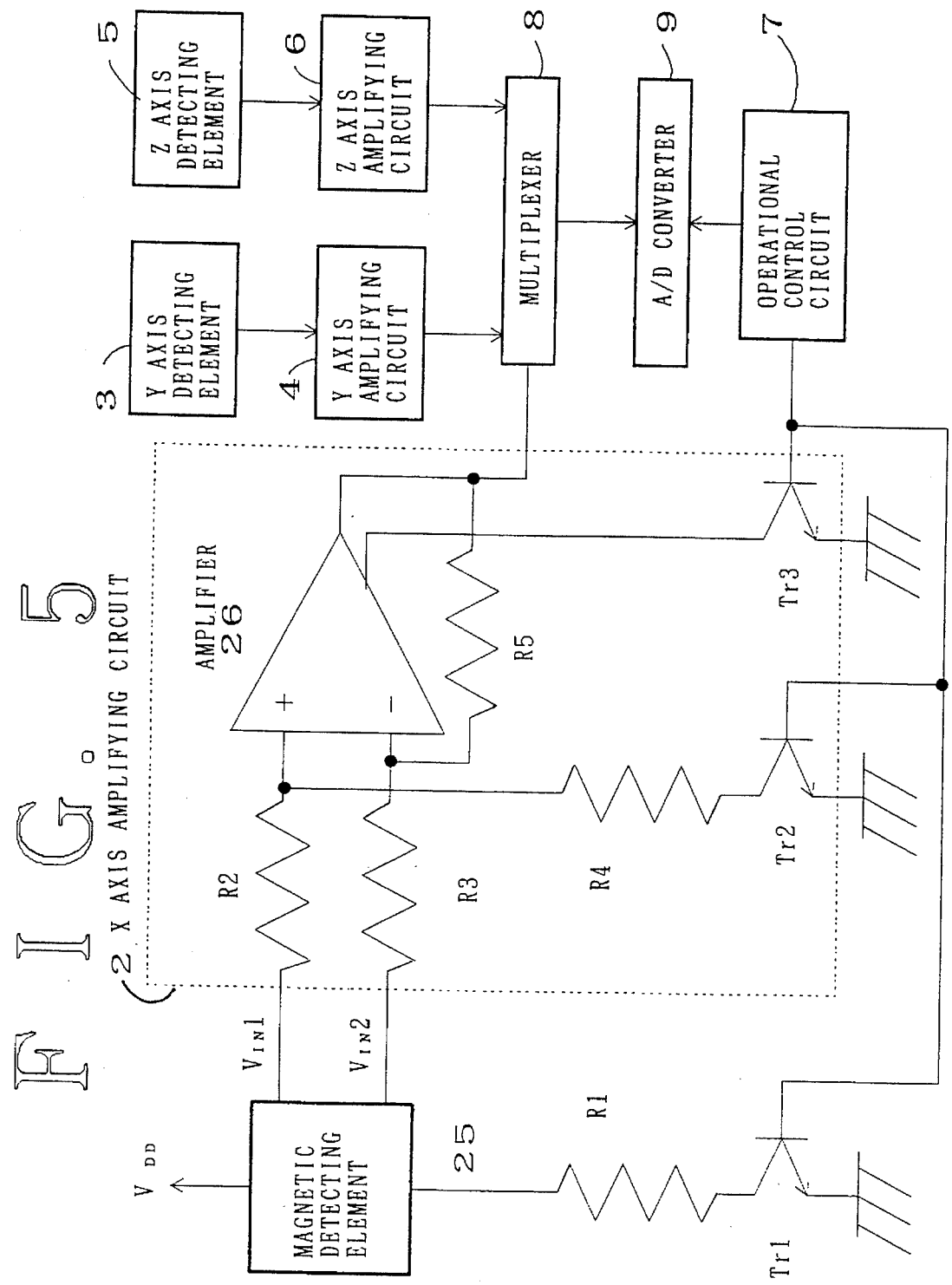
FIG. 5 is a circuit diagram showing a portion of the detecting means and amplifying means of the embodiment of the three-dimensional integrating fluxmeter of the present invention.

FIG. 5 is a circuit diagram showing a portion of detecting element and amplifying circuit of the embodiment of the three-dimensional integrating fluxmeter of the present invention. Detecting element 1 is provided with a magnetic detecting element 25, a current control resistor R1 and a transistor Tr1 which are connected in series with each other. Two output terminals of the magnetic detecting element 25 are input into an amplifier 26 through resistors R2 and R3 used for amplifying. A positive input terminal of an amplifier 26 is grounded through a resistor R4, and a negatively input terminal thereof is negative fed back through a resistor R5. The circuit is constructed as described above so that the circuit comprise a differential amplifying circuit for amplifying the difference between two input voltages. Output voltage $V_{OUT}$ is expressed as follows:

$$V_{out}=(V_{IN}1-V_{IN}2) \cdot R4/R2 \quad (3)$$

where R2 is equal to R3, and R4 is equal to R5.

In the expression, R4/R2 is an amplification factor.

A transistor Tr3 is interconnected between a battery terminal of the amplifier 26 and the ground. Gate terminals of transistors Tr1, Tr2 and Tr3 are controlled by the control signal 21 output from the operational control circuit 7. The control signal 21 outputs "H" when measuring so that the X axis detecting element 1 and the X axis amplifying circuit 2 are turned ON, i.e., set to an operative condition. If the control signal 21 outputs "L," the X axis detecting element 1 and the X axis amplifying circuit 2 are in a non-operative condition and operative current is cut off. The Y axis detecting element 3, the Y axis amplifying circuit 4, the detecting element 5 and the Z axis amplifying circuit 6 are constructed as set forth above.

The control signal output from the operational control circuit 7 is controlled by output signal from the timing signal generating circuit 12. A timing signal is generated from the timing signal generating circuit 12 as follows: the results respectively measured on X axis, Y axis and z axis are output from the A/D converter 9. The measured value comparing circuit 15 is operated to compare a measured value converted by the arithmetic circuit 13 to the magnetic field strength with a measured value stored in the previously measured value memory 16. If rate of change is in a predetermined reference range as a result of the comparison, the timing signal generating circuit 12 is controlled by the output from the measured value comparing circuit 15 and the output signal from the frequency dividing circuit 11. Thus, a timing signal for changing the measuring period is output, and the operational control circuit 7 is controlled. The operational control circuit 7 is operated to control the measuring control signals 20, 21, 22, 23 and 24 according to the output signal from the timing signal generating circuit 12.

Figure 6:
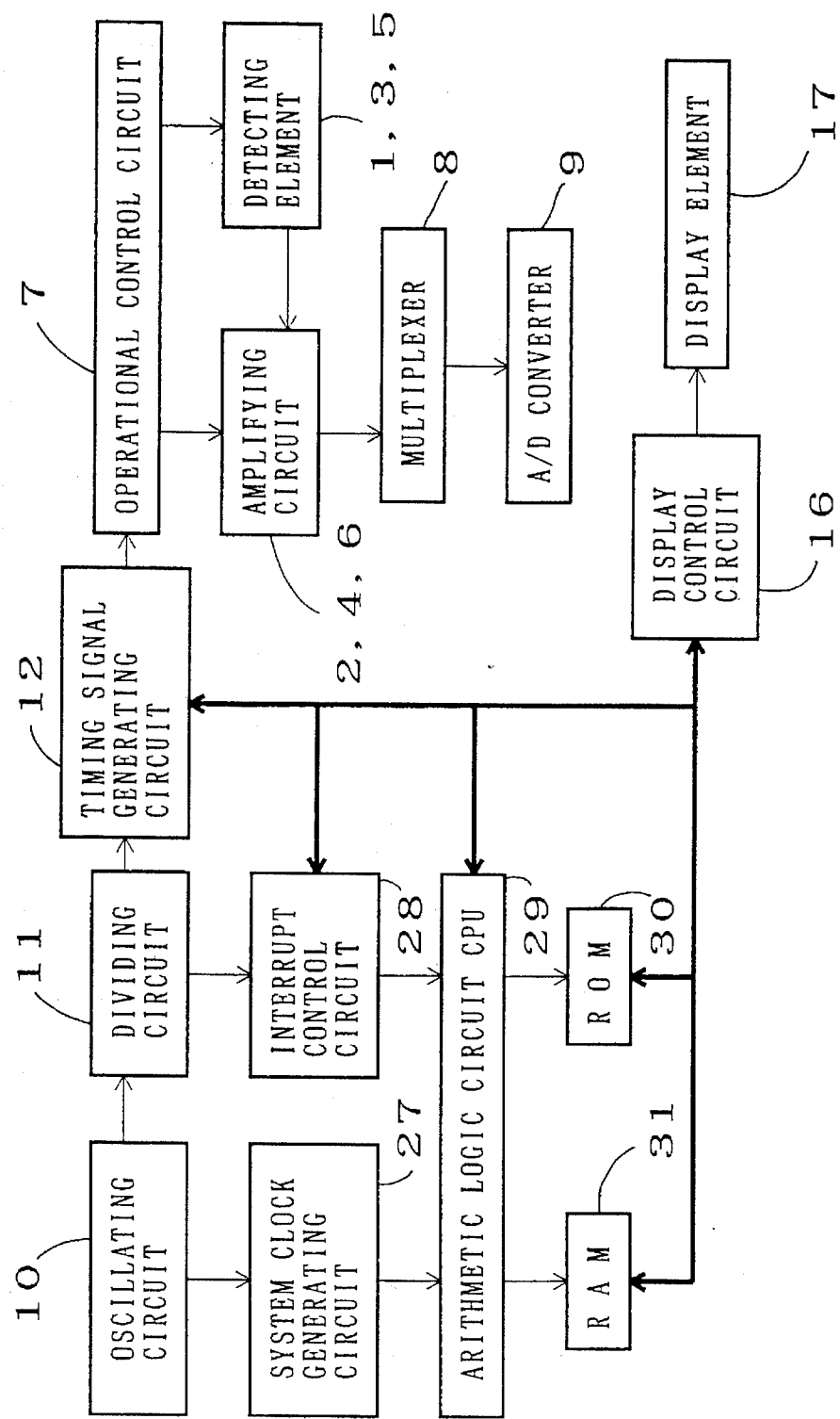
FIG. 6 is a block diagram showing the embodiment of the three-dimensional integrating fluxmeter of the present invention controlled by a microcomputer.

FIG. 6 is a block diagram showing the embodiment controlled by a microcomputer, of the three-dimensional integrating fluxmeter of the present invention.

In FIG. 6, the microcomputer is provided with an arithmetic logic circuit 29 as a center thereof, a program memory (ROM) 30, a data memory (RAM) 31 and the like. The arithmetic logic circuit 29 is provided with ALU (arithmetic and logic unit), arithmetic register, address control register, instruction decoder and the like. Further, the arithmetic logic circuit 29 is connected to peripheral circuits through a data bus and address bus 32.

ROM 30 is a program memory where software instructions are stored. RAM 31 is a data memory which is used to store various information temporarily. A system clock generating circuit 27 receives an output from the oscillating circuit 10 to generate a system clock required for operation of the arithmetic logic circuit 29.

FIG. 7 is a flowchart showing the operating procedure of the embodiment of the three-dimensional integrating fluxmeter of the present invention. The operating procedure which is controlled by a microcomputer will be described with Reference to the flowchart of FIG. 7.

If an interrupt control circuit 28 generates interruption with respect to the arithmetic logic circuit 29, driving on X axis is selected for the operational control circuit 7 so that the operational control circuit 7 outputs the control signal 21 of FIG. 1 to drive the X axis detecting element 1 and X axis amplifying circuit 2 (Step 71). The multiplexer 8 selects the output signal from the X axis amplifying means 2. A WAIT routine is performed for a predetermined period of time until operation of the amplifying means is stabilized (Step 72). A/D converter 9 is the operated to input data converted through the data bus 32 in the arithmetic logic means so as to store it in RAM (Step 73).

If driving on Y axis is selected for the operational control circuit 7, the operational control circuit 7 outputs the control signal 22 of FIG. 1 to drive Y axis detecting element 3 and Y axis amplifying circuit 4. The multiplexer 8 selects the output signal from the Y axis amplifying circuit 4 (Step 74). A WAIT routine is performed for a predetermined period of time until operation of the amplifying circuit is stabilized <Step 75). A/D converter 9 is operated to input data converted through the data bus 32 in the arithmetic logic means so as to store it in RAM (Step 76).

If driving on z axis is selected for the operational control circuit 7, the operational control circuit 7 outputs the control signal 23 of FIG. 1 to drive z axis detecting element 5 and z axis amplifying circuit 6. The multiplexer 8 selects the output signal from the Z axis amplifying circuit 6 (Step 77). WAIT is performed for a predetermined period until operation of the amplifying circuit is stabilized (Step 78). The A/D converter 9 is operated to input data converted through the data bus 30 in the arithmetic logic means so as to store it in RAM (Step 79).

An arithmetic operation is performed based on expression 1 (Step 80). The result of the arithmetic operation based upon the product of the magnetic flux strength and the time period is calculated and added to the integrated value memory 14, and the accumulated value is stored again (Step 81). The result of the arithmetic operation is compared with previously measured result (Step 82). The measuring time period is then is determined depending upon the result of comparison (Step 83). The measured result is stored in the previously measured value memory 16 (Step 84).

The product of the obtained magnetic field strength and the time of the measuring period is then added to to content of integrated value memory 14 (Step 85).

The calculated time of the measuring period is added to the time counting circuit 17, and is stored again (Step 86). The display is processed to update the display element 19 (Step 87). Then, the process returns to a HALT condition (Step 88).

As set forth above, a portable fluxmeter of the present invention is provided to count integrated value of the magnitude of the magnetic flux due to continued exposure. The fluxmeter is provided with the timing generating means for determining timing of measuring period, and the operational control means for controlling operations of detecting means disposed in three-dimensions and the amplifying means for amplifying each detected output. Thus, there are several effects in that power consumption can be reduced, and operating time by a built-in battery can be extended.

What is claimed is:

1. A fluxmeter for measuring magnetic field strength comprising:

three magnetic detecting means each disposed in one of three dimensions and each for detecting the strength of an incident magnetic field in one of the X, Y and Z axial directions and for outputting a corresponding output electrical signal;

three amplifying means for amplifying respective output electrical signals from said three magnetic detecting means;

operational control means for generating a control signal for sequentially controlling the operation of said magnetic detecting means and said amplifying means;

a multiplexer controlled by the operational control means for sequentially selecting respective output signals from said three amplifying means according to the control signal from said operational control means;

analog-to-digital converting means controlled by the operational control means for sequentially converting analog signals output from said multiplexer to corresponding digital signals;

arithmetic means controlled by the operational control means for sequentially receiving digital signals from the analog-to-digital converting means, the respective digital signals corresponding to sequentially detected incident magnetic field strength components in X, Y and Z axis directions, for calculating a three-dimensional magnetic flux strength vector in the X, Y and Z axis dimensions in accordance with the respective digital signals, for calculating a measuring time and for calculating the product of the magnetic flux strength vector and the measuring time;

integrated value storage means for accumulating respective products of said measuring time and said magnetic flux strength vector;

measured value storage means for temporarily storing respective products of each said magnetic flux strength vector and said measuring time;

measured value comparing means for comparing respective products of said magnetic flux strength vector and said measuring time with previously measured products of said magnetic flux strength vector and measuring time;

timing signal generating means for changing the measuring period according to an output signal from said measured value comparing means;

time counting means for counting said measuring time; and display means for displaying the content of said integrated value storage means.

2. A fluxmeter as claimed in claim 1; wherein said operational control means drives said three magnetic detecting means and corresponding amplifying means on time-sharing basis.

3. A fluxmeter as claimed in claim 1; wherein said operational control means is operated to cut off current through respective ones of said three detecting means and amplifying means when respective ones of the detecting means and amplifying means are not selected.

* * * * *